US009508704B2

(12) United States Patent
Chung et al.

(10) Patent No.: US 9,508,704 B2
(45) Date of Patent: Nov. 29, 2016

(54) METHOD OF FABRICATING SEMICONDUCTOR PACKAGE, SEMICONDUCTOR PACKAGE FORMED THEREBY, AND SEMICONDUCTOR DEVICE INCLUDING THE SAME

(71) Applicant: Samsung Electronics Co., Ltd., Suwon-Si, Gyeonggi-Do (KR)

(72) Inventors: Hyunsoo Chung, Hwaseong-si (KR); InYoung Lee, Yongin-si (KR); Taeje Cho, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/611,585

(22) Filed: Feb. 2, 2015

(65) Prior Publication Data
US 2015/0318261 A1 Nov. 5, 2015

(30) Foreign Application Priority Data

Apr. 30, 2014 (KR) ........................ 10-2014-0052581

(51) Int. Cl.
*H01L 21/34* (2006.01)
*H01L 25/00* (2006.01)
(Continued)

(52) U.S. Cl.
CPC ........... *H01L 25/50* (2013.01); *H01L 21/3043* (2013.01); *H01L 21/30604* (2013.01); *H01L 21/561* (2013.01); *H01L 21/563* (2013.01); *H01L 21/565* (2013.01); *H01L 21/76897* (2013.01); *H01L 21/76898* (2013.01); *H01L 23/00* (2013.01); *H01L 23/29* (2013.01); *H01L 23/293* (2013.01); *H01L 23/31* (2013.01); *H01L 23/3135* (2013.01); *H01L 23/3178* (2013.01); *H01L 23/498* (2013.01); *H01L 23/49827* (2013.01); *H01L 23/538* (2013.01); *H01L 23/5384* (2013.01); *H01L 24/03* (2013.01); *H01L 24/08* (2013.01); *H01L 24/89* (2013.01); *H01L 24/94* (2013.01); *H01L 24/97* (2013.01);
(Continued)

(58) Field of Classification Search
CPC ...................................... H01L 21/304
See application file for complete search history.

(56) References Cited

U.S. PATENT DOCUMENTS 6,492,196 B1 * 12/2002 Chen .................. H01L 21/56
257/E21.502
6,815,749 B1 11/2004 Mandelman et al.
(Continued)

FOREIGN PATENT DOCUMENTS

KR 20090084645 A 8/2009
KR 20100061456 A 6/2010
(Continued)

*Primary Examiner* — Lex Malsawma
(74) *Attorney, Agent, or Firm* — Harness, Dickey & Pierce, P.L.C.

(57) ABSTRACT

The method of fabricating a semiconductor package including preparing a semiconductor wafer having a first side and a second side, the second side facing the first side, and the semiconductor wafer including a through via exposed through the first side, forming trenches at cutting areas between chip areas and at edge areas of the semiconductor wafer on the first side, stacking a semiconductor chip on the through via, forming an under fill resin layer to fill a gap between the semiconductor chip and the semiconductor wafer and to cover a side of the semiconductor chip, and forming a molding layer to cover at least a portion of the under fill resin layer and to fill at least a portion of the respective trenches may be provided.

14 Claims, 24 Drawing Sheets

(51) Int. Cl.
*H01L 25/065* (2006.01)
*H01L 21/768* (2006.01)
*H01L 21/306* (2006.01)
*H01L 23/00* (2006.01)
*H01L 21/56* (2006.01)
*H01L 21/304* (2006.01)
*H01L 23/31* (2006.01)
*H01L 23/538* (2006.01)
*H01L 23/498* (2006.01)
*H01L 23/29* (2006.01)
*H01L 25/10* (2006.01)

(52) U.S. Cl.
CPC ....... *H01L 25/0652* (2013.01); *H01L 25/0657* (2013.01); *H01L 25/105* (2013.01); H01L 2224/0401 (2013.01); H01L 2224/0557 (2013.01); H01L 2224/06181 (2013.01); H01L 2224/16145 (2013.01); H01L 2224/16227 (2013.01); H01L 2224/16235 (2013.01); H01L 2224/17181 (2013.01); H01L 2224/32145 (2013.01); H01L 2224/32225 (2013.01); H01L 2224/92152 (2013.01); H01L 2224/94 (2013.01); H01L 2224/97 (2013.01); H01L 2225/06513 (2013.01); H01L 2225/06517 (2013.01); H01L 2225/06541 (2013.01); H01L 2225/06548 (2013.01); H01L 2225/06565 (2013.01); H01L 2225/06596 (2013.01); H01L 2225/107 (2013.01); H01L 2225/1023 (2013.01); H01L 2225/1058 (2013.01); H01L 2924/1431 (2013.01); H01L 2924/1432 (2013.01); H01L 2924/1436 (2013.01); H01L 2924/15192 (2013.01); H01L 2924/15311 (2013.01); H01L 2924/15331 (2013.01); H01L 2924/18161 (2013.01)

(56) References Cited

U.S. PATENT DOCUMENTS

| | | | |
|---|---|---|---|
| 7,674,654 B2 | 3/2010 | Brunnbauer et al. | |
| 7,786,584 B2 | 8/2010 | Barth et al. | |
| 7,863,092 B1* | 1/2011 | Chaware | H01L 21/6835 438/106 |
| 7,932,179 B2 | 4/2011 | Oliver et al. | |
| 8,227,839 B2 | 7/2012 | West | |
| 8,288,201 B2* | 10/2012 | Pagaila | H01L 21/56 257/687 |
| 8,426,256 B2 | 4/2013 | Hsiao et al. | |
| 8,446,017 B2 | 5/2013 | Paek et al. | |
| 8,486,758 B2 | 7/2013 | Oganesian et al. | |
| 8,525,347 B2 | 9/2013 | Barth et al. | |
| 8,551,881 B2 | 10/2013 | Shih et al. | |
| 8,624,241 B2 | 1/2014 | Oh | |
| 8,643,148 B2 | 2/2014 | Lin et al. | |
| 8,754,514 B2 | 6/2014 | Yu et al. | |
| 8,791,562 B2 | 7/2014 | Lee et al. | |
| 8,927,335 B2* | 1/2015 | Wimplinger | H01L 21/568 257/686 |
| 2005/0046002 A1* | 3/2005 | Lee | H01L 21/76898 257/678 |
| 2007/0278653 A1 | 12/2007 | Brunnbauer et al. | |
| 2008/0230913 A1 | 9/2008 | Huang et al. | |
| 2009/0014889 A1 | 1/2009 | Barth et al. | |
| 2009/0134497 A1 | 5/2009 | Barth et al. | |
| 2010/0279463 A1 | 11/2010 | Hsiao et al. | |
| 2011/0068427 A1 | 3/2011 | Paek et al. | |
| 2011/0068444 A1* | 3/2011 | Chi | H01L 21/6835 257/669 |
| 2011/0227227 A1 | 9/2011 | West | |
| 2011/0241040 A1 | 10/2011 | Yu et al. | |
| 2012/0018871 A1 | 1/2012 | Lee et al. | |
| 2012/0038045 A1 | 2/2012 | Lee | |
| 2012/0138925 A1 | 6/2012 | Oh | |
| 2012/0153488 A1 | 6/2012 | Oganesian et al. | |
| 2012/0270394 A1 | 10/2012 | Shih et al. | |
| 2012/0282735 A1 | 11/2012 | Ahn et al. | |
| 2013/0037950 A1 | 2/2013 | Yu et al. | |
| 2013/0093094 A1* | 4/2013 | Sung | H01L 21/78 257/773 |
| 2013/0134559 A1 | 5/2013 | Lin et al. | |
| 2013/0277857 A1 | 10/2013 | Yoo | |
| 2011/6241040 | 1/2014 | Ahn et al. | |
| 2015/0171034 A1* | 6/2015 | Yu | H01L 24/02 257/777 |

FOREIGN PATENT DOCUMENTS

| | | |
|---|---|---|
| KR | 20110036248 A | 4/2011 |
| KR | 20110056469 A | 5/2011 |
| KR | 101091551 B1 | 12/2011 |
| KR | 20120057693 A | 6/2012 |
| KR | 20120123919 A | 11/2012 |
| KR | 20130018090 A | 2/2013 |
| KR | 20130037105 A | 4/2013 |
| KR | 20130061037 A | 6/2013 |
| KR | 20130078948 A | 7/2013 |
| KR | 20130117290 A | 10/2013 |
| KR | 20130129938 A | 11/2013 |

* cited by examiner

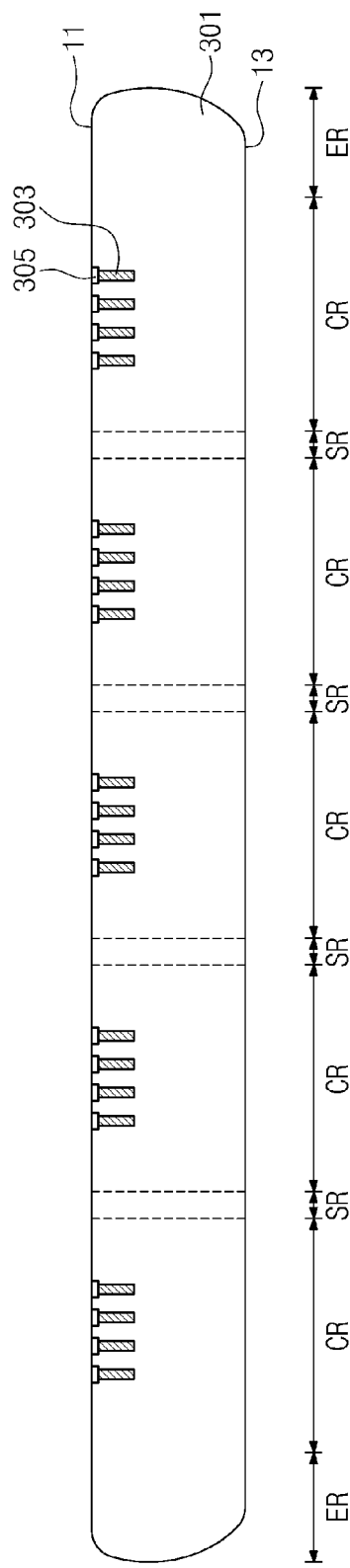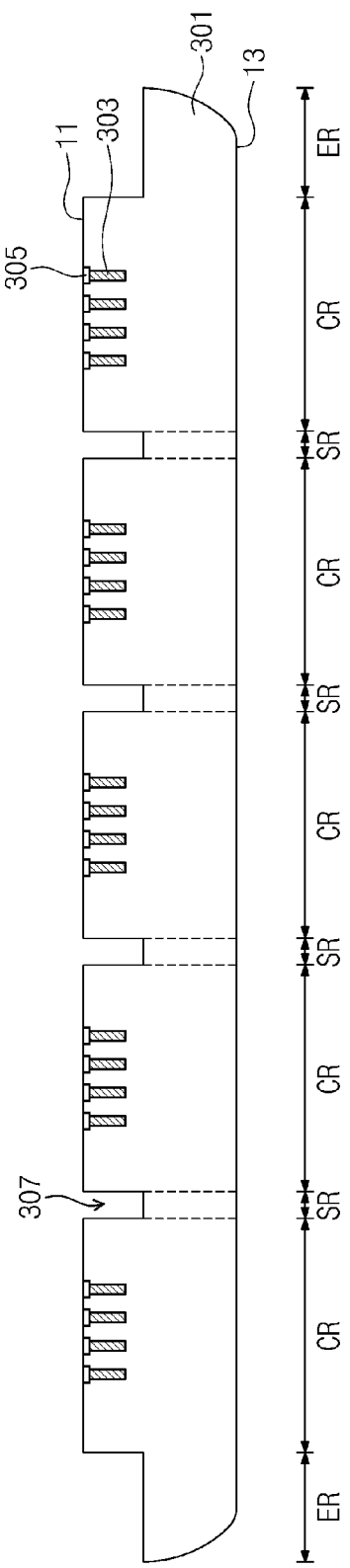

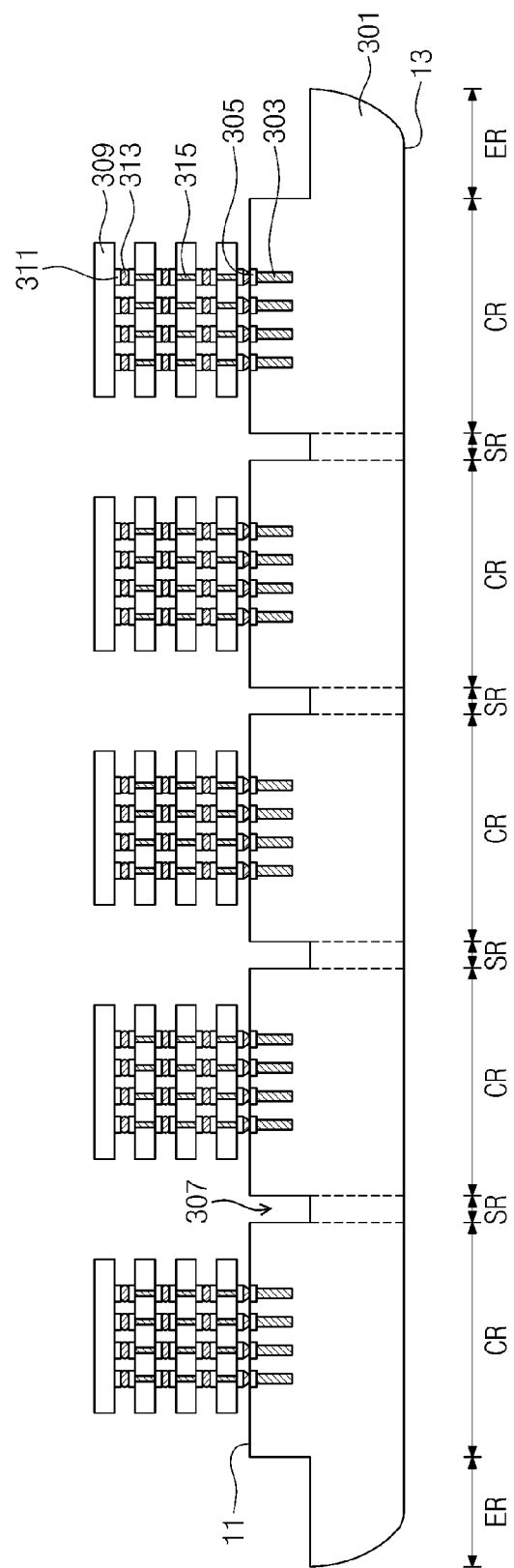

METHOD OF FABRICATING SEMICONDUCTOR PACKAGE, SEMICONDUCTOR PACKAGE FORMED THEREBY, AND SEMICONDUCTOR DEVICE INCLUDING THE SAME

CROSS-REFERENCE TO RELATED APPLICATIONS

This U.S. non-provisional patent application claims priority under 35 U.S.C. §119 to Korean Patent Application No. 10-2014-0052581, filed on Apr. 30, 2014, the entire contents of which are hereby incorporated by reference.

BACKGROUND

Example embodiments relate to semiconductor packages, fabrication methods thereof and/or semiconductor devices including one or more of the semiconductor packages, and more particularly, to chip stacked packages having a high bandwidth memory (HBM) structure and fabrication methods thereof, and/or semiconductor devices including one or more of the chip stacked packages.

As a demand for high performance characteristics for a stacked chip package implemented through a typical wire bonding technique increases, research has been conducted on a three-dimensional package employing a through silicon via (TSV) technique. In such three-dimensional packages, devices having various functions are stacked vertically such that expanded memory capacity, lower power consumption, higher transmission rate, and/or higher efficiency can be realized. One example of such three-dimensional packages is a HBM package in which a stacked layer of memory devices is packaged with, for example, a central processing unit (CPU) or a system on chip, by using a TSV interposer.

SUMMARY

Some example embodiments provide methods of fabricating semiconductor packages having improved reliability.

Some example embodiments provide semiconductor packages having improved reliability.

According to an example embodiment of the inventive concepts, a method of fabricating a semiconductor package includes preparing a semiconductor wafer having a first side and a second side, the second side facing the first side, and the semiconductor wafer including a through via exposed at the first side, forming trenches at cutting areas between chip areas and at edge areas of the semiconductor wafer on the first side, stacking a semiconductor chip on the through via, forming an under fill resin layer to fill a gap between the semiconductor chip and the semiconductor wafer and to cover a side of the semiconductor chip, and forming a molding layer to cover the under fill resin layer and to fill at least a portion of the respective trenches.

In some example embodiments, the forming trenches may include forming the trenches to have a depth equal to or deeper than the through via.

In some example embodiments, the forming an under fill resin layer may include forming the under fill resin layer on the semiconductor wafer.

In some example embodiments, the forming an under fill resin layer may include forming the under fill resin layer to extend toward sides of the trenches.

In some example embodiments, the method may further includes, after the forming a molding layer, polishing the second side of the semiconductor wafer to expose the through via, simultaneously forming a redistribution layer and a test pad on the second side of the semiconductor wafer, and cutting the cutting areas and the edge areas of the semiconductor wafer to form a semiconductor package.

In some example embodiments, the forming a molding layer may include forming the molding layer to completely cover a top of the semiconductor layer.

According to an example embodiment of the inventive concepts, a semiconductor package includes a semiconductor chip stacked on a substrate, an under fill resin layer filling between the semiconductor chip and the substrate and covering a side of the semiconductor chip, and a molding layer covering the under fill resin layer and a side surface of the substrate.

In some example embodiments, the under fill resin layer may cover both a top surface and the side surface of the substrate completely.

In some example embodiments, a width of the under fill resin layer at a bottom may be wider than a width of the under fill resin layer at a top.

In some example embodiments, a width of the under fill resin layer at a bottom may be narrower than or the same as to a width as the substrate.

According to an example embodiments, the semiconductor packages may further include a substrate through via penetrating the substrate, a chip through via penetrating the semiconductor chip, a chip terminal between the substrate, the chip terminal electrically connecting the substrate through via to the chip through via, a redistribution layer electrically connected to the substrate through via at a bottom of the substrate, and a substrate terminal attached to the redistribution layer.

According to an example embodiments, a method of fabricating a semiconductor package includes forming trenches in a first surface of a semiconductor wafer at cutting areas between chip areas and at edge areas of the semiconductor wafer, stacking at least one first semiconductor chip on the first surface, forming an under fill resin layer to fill a gap between the first semiconductor chip and the semiconductor wafer and to cover a side of the first semiconductor chip, and forming a molding layer to cover at least a portion of the under fill resin layer and to fill at least a portion of each of the trenches.

In some example embodiments, the forming a molding layer may include forming the molding layer to cover a lower portion of a side surface of the under fill resin layer.

In some example embodiments, the forming a molding layer may include forming the molding layer to cover side surfaces of the trenches.

In some example embodiments, the forming a molding layer may include forming the molding layer to expose a top surface of the first semiconductor chip.

In some example embodiments, the forming an under fill resin layer may include forming the under fill resin layer to cover side surfaces of the trenches.

In some example embodiments, the forming an under fill resin layer may be performed such that a width of the under fill resin layer at a bottom is wider than a width of the under fill resin layer at a top.

In some example embodiments, a width of the under fill resin layer at a bottom may be narrower than or substantially equal to a width of the substrate.

In some example embodiments, the method may further include thinning, subsequent to the forming a molding layer, the second surface of the semiconductor wafer to a thickness to expose a chip through via embedded in the semiconductor wafer, and mounting the semiconductor wafer on an interposer including an interposer through via such that the chip through via at the second surface of the semiconductor wafer is electrically connected to at least one second semiconductor chip via and the interposer through via.

BRIEF DESCRIPTION OF THE DRAWINGS

The accompanying drawings are included to provide a further understanding of the inventive concepts, and are incorporated in and constitute a part of this disclosure. The drawings illustrate some example embodiments of the inventive concepts and, together with the description, serve to explain principles of the inventive concepts. In the drawings:

FIGS. 7 to 17 are cross-sectional views illustrating a method of fabricating a semiconductor package according to an example embodiment of the inventive concepts. In particular, FIG. 14 is an enlarged cross-sectional view of XIV of FIG. 13;

DETAILED DESCRIPTION OF EXAMPLE EMBODIMENTS

Figure 1:
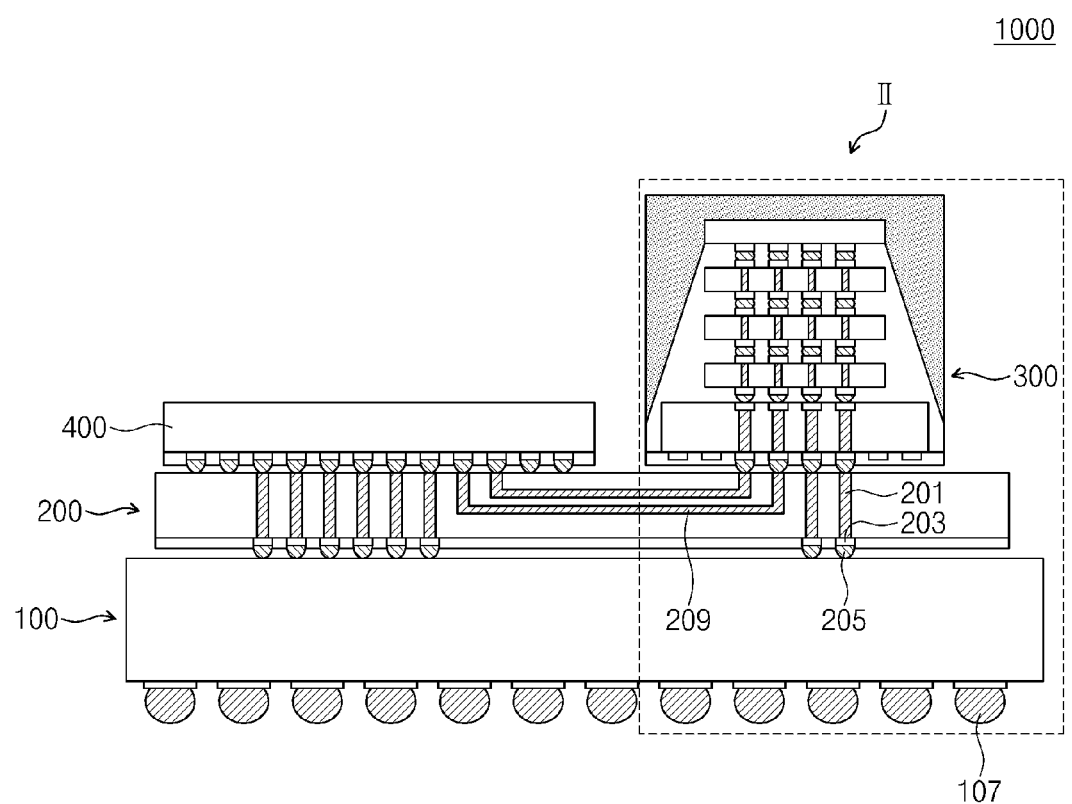
FIG. 1 is a cross-sectional view of a semiconductor package according to a first example embodiment of the inventive concepts.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Expressions such as "at least one of," when preceding a list of elements, modify the entire list of elements and do not modify the individual elements of the list.

Hereinafter, some example embodiments will be explained in further detail with reference to the accompanying drawings.

Figure 2:
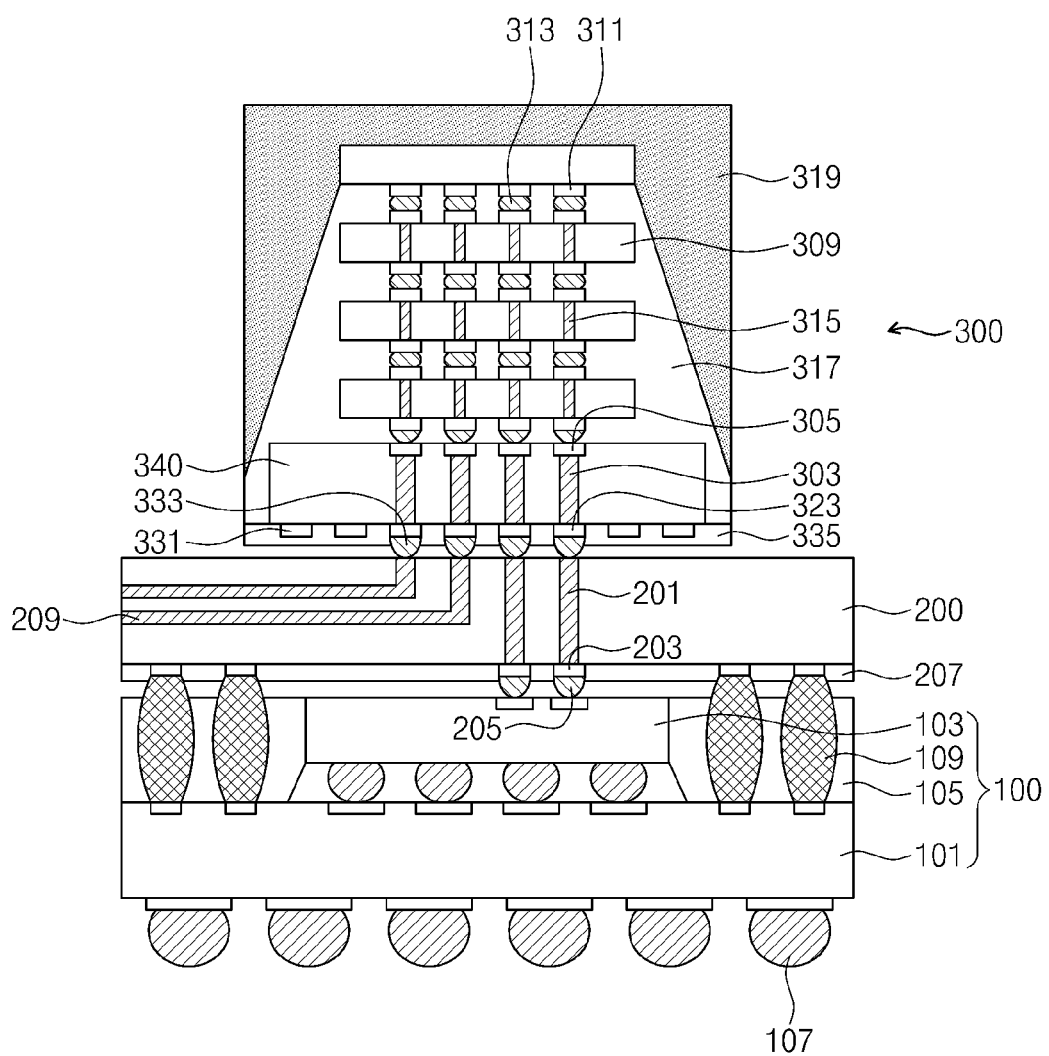
FIG. 2 is an enlarged cross-sectional view of II of FIG. 1.

FIG. 1 is a cross-sectional view of a semiconductor package according to a first example embodiment of the inventive concepts. FIG. 2 is an enlarged cross-sectional view of II of FIG. 1.

Referring to FIGS. 1 and 2, a semiconductor device 1000 includes an interposer substrate 200 stacked on a logic semiconductor package 100 and a chip stacked semiconductor package 300 stacked on the interposer substrate 200.

The chip stacked semiconductor package 300 includes a semiconductor substrate 340, a plurality of first semiconductor chips 309 vertically stacked on the semiconductor substrate 340, and a first molding layer 319 covering the first semiconductor chips 309.

The semiconductor substrate 340 may include a first through via 303 penetrating the semiconductor substrate 340. The first through via 303 may contact a first conductive pad 305 disposed at the top of the semiconductor substrate 340 and a redistribution layer 323 disposed at the bottom of the semiconductor substrate 340. A first terminal 333 may be attached to the redistribution layer 323. A test pad 331 may be further disposed at the bottom of the semiconductor substrate 340. The redistribution layer 323 and the test pad 331 may be covered by a first passivation layer 335.

The first semiconductor chips 309 may include chip through vias 315 penetrating the first semiconductor chips 309. The chip through vias 315 may contact chip pads 311 disposed at the surfaces of the first semiconductor chips 309 and chip terminals 313 may be disposed between the facing chip pads 311. The chip through vias 315 may provide electrical connection between the first semiconductor chips 309. The first semiconductor chips 309 may be memory chips (for example, DRAM). Accordingly, the chip stacked semiconductor package 300 may be a memory semiconductor package.

Further, an under fill resin layer 317 filling between the first semiconductor chips 309 may be included. The under fill resin layer 317 may cover sides of the first semiconductor chips 309. The under fill resin layer 317 may be formed to completely cover a top and the sides of the semiconductor substrate 340. A width of the under fill resin layer 317 at a bottom may be broader than a width of the under fill resin layer 317 at a top. The first molding layer 319 may be formed on the under fill resin layer 317.

The interposer substrate 200 may include a second through via 201 penetrating the interposer substrate 200. The second through via 201 may contact the first terminal 333 of the chip stacked semiconductor package 300 such that the interposer substrate 200 and the chip stacked semiconductor package 300 are electrically connected to each other. An interposer pad 203 and a second terminal 205 attached to the interposer pad 203 may be disposed at a bottom of the interposer substrate 200. A second passivation layer 207 exposing the second terminal 205 and covering the interposer pad 203 may be further included.

A central processing unit (CPU) 400 may be further mounted on the interposer substrate 200. The CPU 400 may be electrically connected to the chip stacked semiconductor package 300 through interconnections 209 formed in the interposer substrate 200.

A logic semiconductor package 100 may include a second semiconductor chip 103 stacked on a printed circuit board 101 in a flip chip manner, a second molding layer 105 covering the second semiconductor chip 103 on the printed circuit board 101, and an external terminal 107 attached to a bottom of the printed circuit board 101. The second semiconductor chip 103 may be a logic chip. The second through via 201 may connect the chip stacked semiconductor package 300 and the second semiconductor chip 103 electrically. Accordingly, the chip stacked semiconductor package 300 may be connected to the second semiconductor chip 103 of the logic semiconductor package 100 through the second through via 201. Furthermore, a conductive connection terminal 109 may be provided between the interposer substrate 200 and the printed circuit board 101 such that the logic semiconductor package 100 and the interposer substrate 200 are electrically connected to each other.

Figure 3:
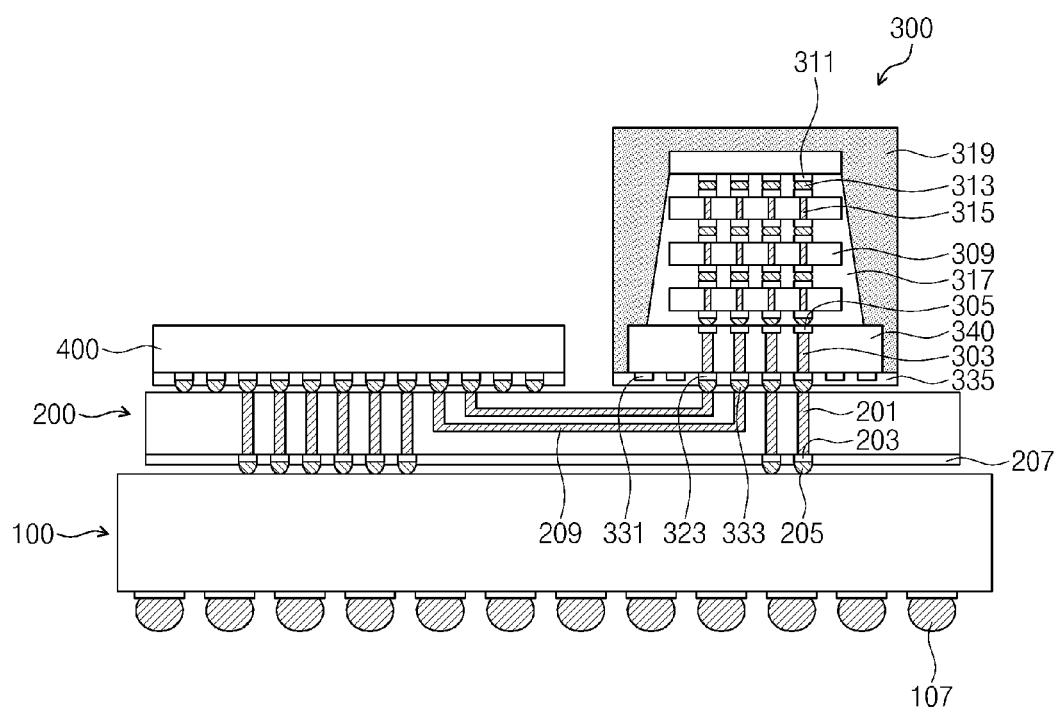
FIG. 3 is a cross-sectional view of a semiconductor package according to a second example embodiment of the inventive concepts.

FIG. 3 is a cross-sectional view of a semiconductor device including a semiconductor package according to a second example embodiment of the inventive concepts. For convenience of description, like reference numerals refer to like elements that are substantially identical to those in the first example embodiment shown in FIGS. 1 and 2 and only elements different from those in the first example embodiment are described.

Referring to FIG. 3, in relation to a semiconductor device 2000, the under fill resin layer 317 may be disposed on the top of the semiconductor substrate 340, filling gaps between the first semiconductor chips 309, and covering the sides of the first semiconductor chips 309. A width of the under fill resin layer 317 at a bottom may be a narrower than a width of the semiconductor substrate 340 and may be wider than a width of the under fill resin layer 317 at a top. The first molding layer 319 may cover the surface of the under fill resin layer 317 and the top and sides of the semiconductor substrate 340 exposed to the under fill resin layer 317.

Figure 4:
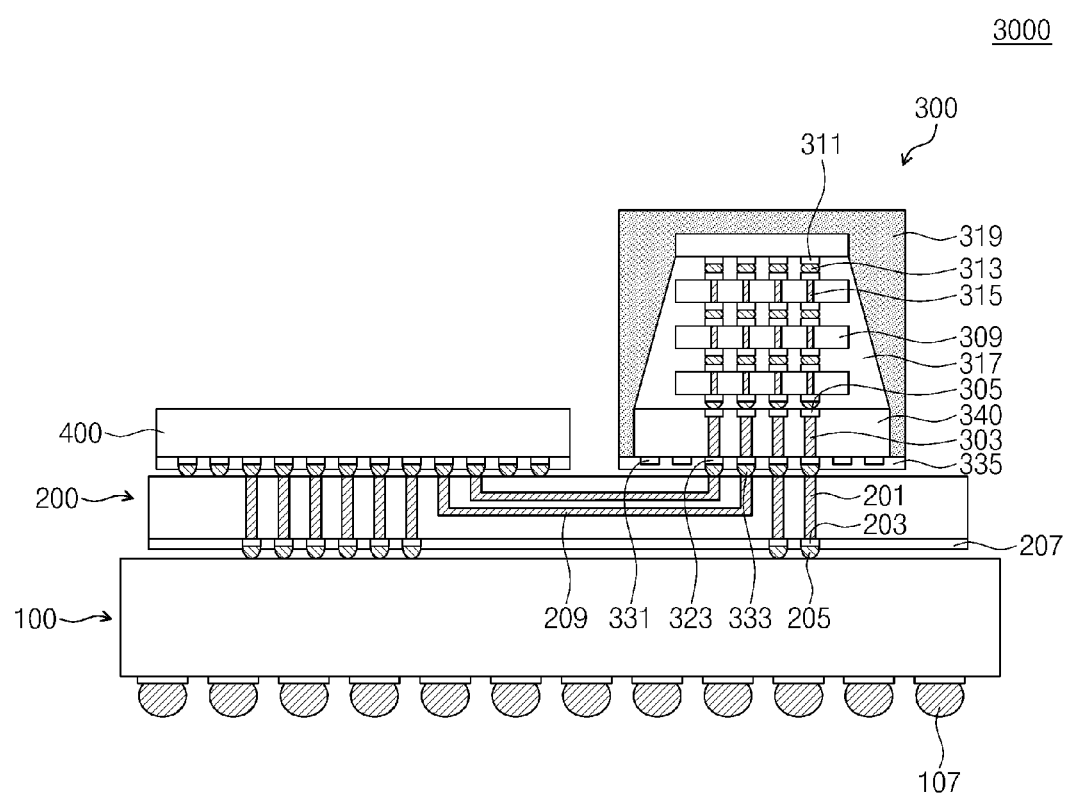
FIG. 4 is a cross-sectional view of a semiconductor device including a semiconductor package according to a third example embodiment of the inventive concepts.

FIG. 4 is a cross-sectional view of a semiconductor device including a semiconductor package according to a third example embodiment of the inventive concepts. For convenience of description, like reference numerals refer to like elements that are substantially identical to those in the first embodiment shown in FIGS. 1 and 2 and only elements different from those in the first example embodiment are described.

Referring to FIG. 4, in relation to a semiconductor device 3000, the under fill resin layer 317 may be disposed on the top of the semiconductor substrate 340, filling gaps between the first semiconductor chips 309, and covering the sides of the first semiconductor chips 309. A width of the under fill resin layer 317 at the bottom may be equal to a width of the semiconductor substrate 340 and may be a wider than a width of the under fill resin layer 317 at a top. The first molding layer 319 may cover the surface of the under fill resin layer 317 and the sides of the semiconductor substrate 340.

Figure 5:
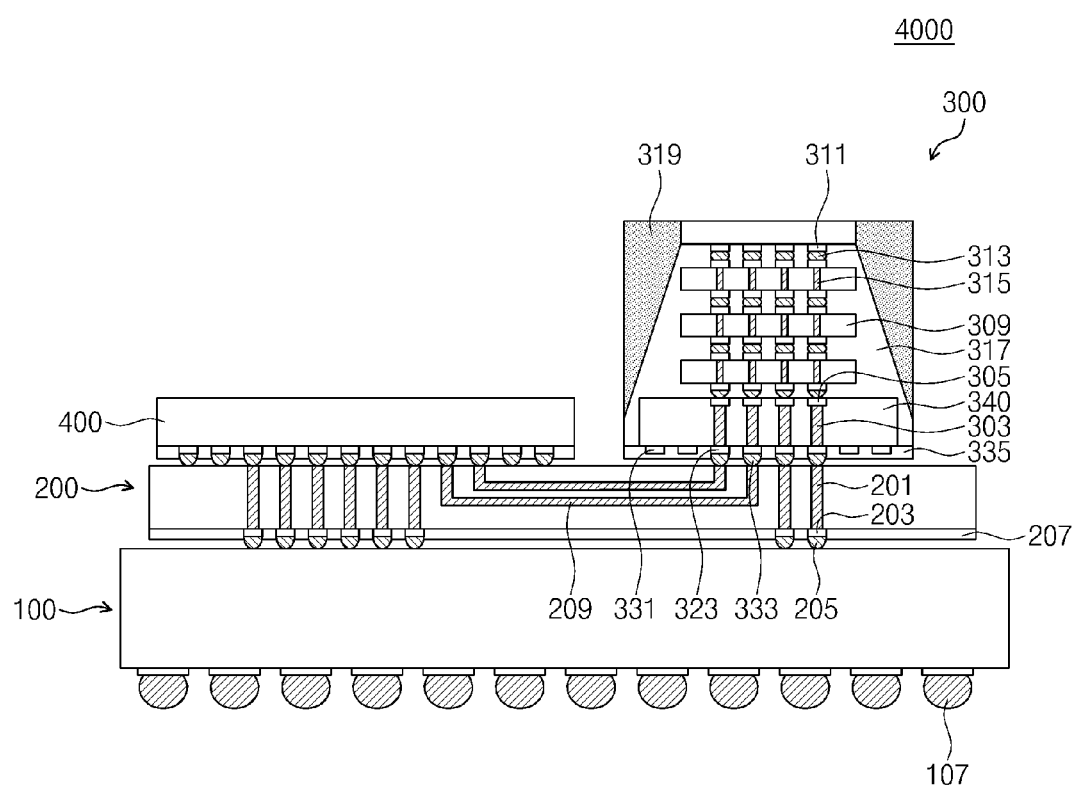
FIG. 5 is a cross-sectional view of a semiconductor device including a semiconductor package according to a fourth example embodiment of the inventive concepts.

FIG. 5 is a cross-sectional view of a semiconductor device including a semiconductor package according to a fourth example embodiment of the inventive concepts. For convenience of description, like reference numerals refer to like elements that are substantially identical to those in the first embodiment shown in FIGS. 1 and 2 and only elements different from those in the first example embodiment are described.

Referring to FIG. 5, in relation to a semiconductor device 4000, the under fill resin layer 317 may completely cover the top and sides of the semiconductor substrate 340 and the first molding layer 319 may be formed to expose a top of an uppermost one of the first semiconductor chips 309.

Figure 6:
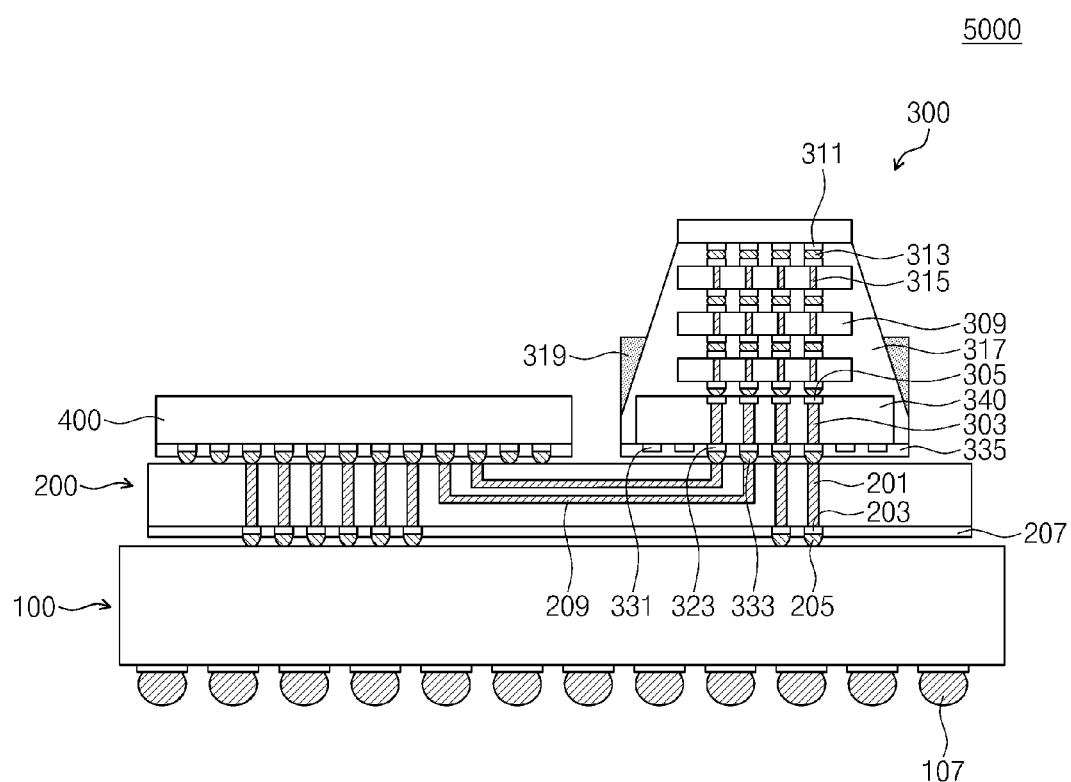
FIG. 6 is a cross-sectional view of a semiconductor package according to a fifth example embodiment of the inventive concepts.

FIG. 6 is a cross-sectional view of a semiconductor package according to a fifth example embodiment of the inventive concepts. For convenience of description, like reference numerals refer to like elements that are substantially identical to those in the fourth example embodiment shown in FIG. 5 and only elements different from those in the fourth example embodiment are described.

Referring to FIG. 6, in relation to a semiconductor device 5000, the under fill resin layer 317 may completely cover the top and sides of the semiconductor substrate 340 and the first molding layer 319 may be formed to cover a portion of the under fill resin layer 317. Accordingly, the top and sides of the uppermost one of the first semiconductor chips 309 may be exposed through the under fill resin layer 317 and the first molding layer 319.

Figure 12:
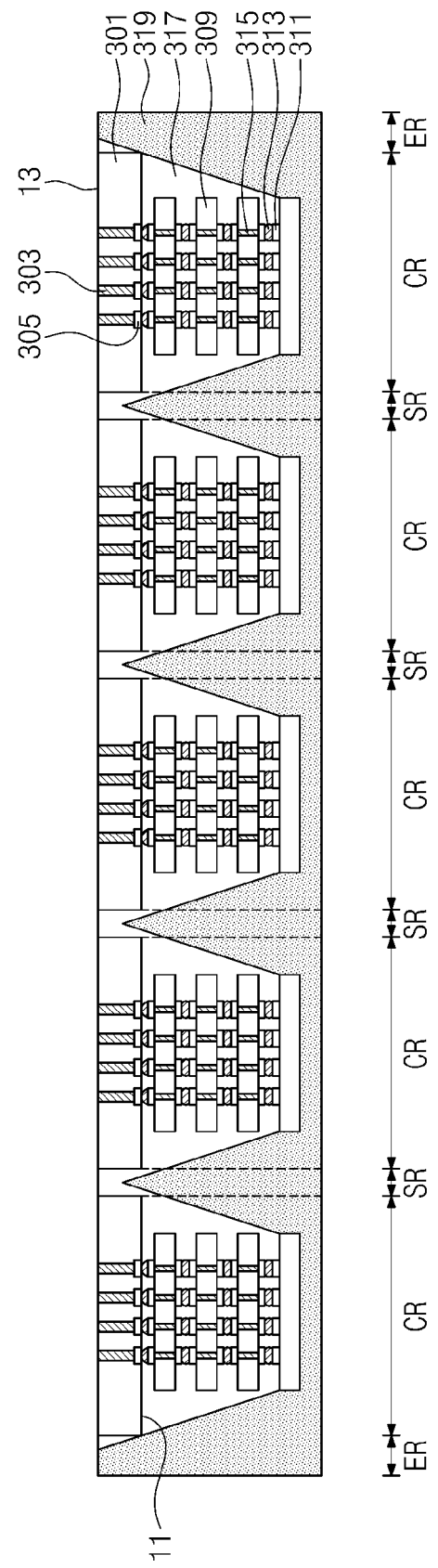
Figure 13:
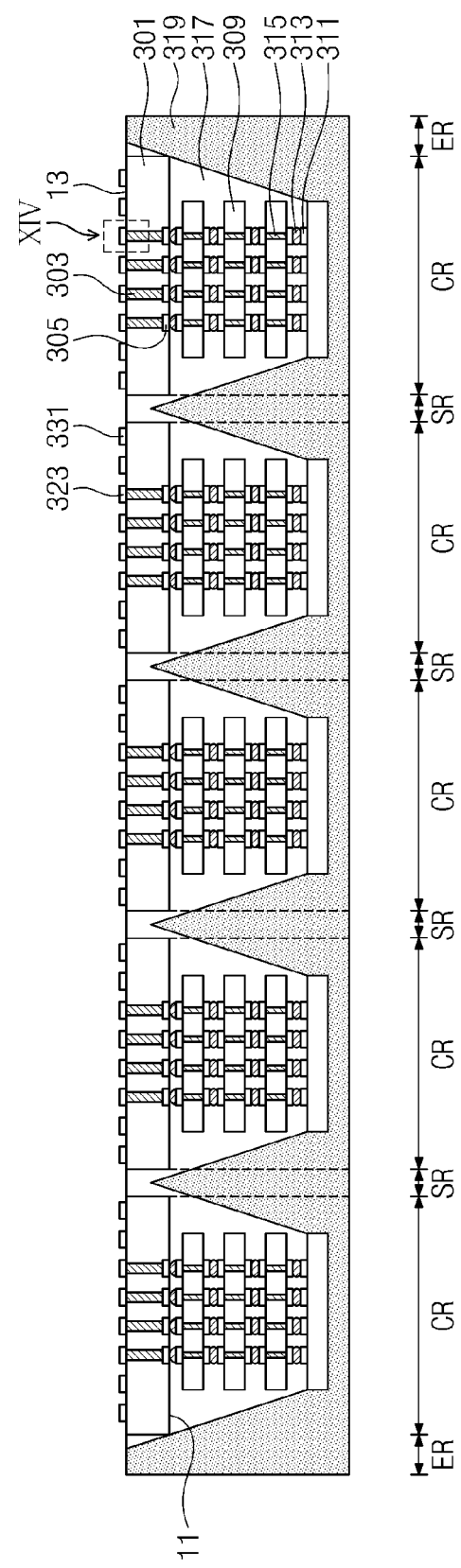
Figure 14:
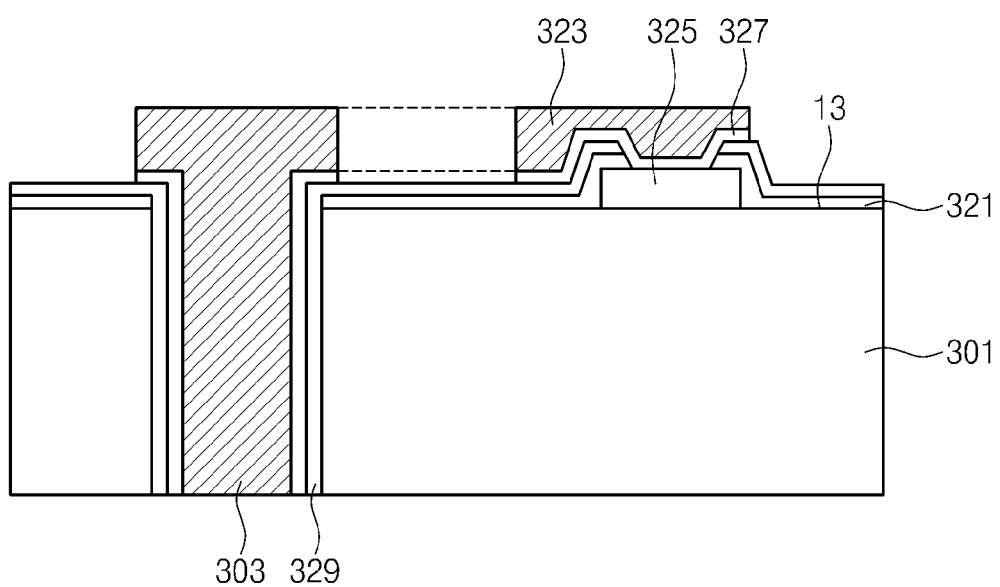

FIGS. 7 to 17 are cross-sectional views illustrating a method of fabricating a semiconductor package according to an example embodiment of the inventive concepts. In particular, FIG. 14 is an enlarged cross-sectional view of XIV of FIG. 13.

Referring to FIG. 7, a semiconductor wafer 301 is prepared. The semiconductor wafer 301 may include one side 11 and the other side 13 facing the one side 11. The semiconductor wafer 301 may include chip areas CR and a cutting area SR between the chip areas CR. The semiconductor wafer 301 may further edge areas ER at edges of the semiconductor wafer 301. A semiconductor device, for example, a transistor may be formed at the one side 11 of the semiconductor wafer 301 and an area where the semiconductor device is formed may be defined as an active area. The semiconductor wafer 301 may be, for example, a single crystal silicon wafer or a polycrystalline silicon wafer. The polycrystalline silicon wafer may include GaAs, LiTaO3, LiNbO3, or sapphire, for example. First through vias 303 may be formed in the chip areas CR of the semiconductor wafer 301. The first through vias 303 may be formed to extend from the one side 11 of the semiconductor wafer 301. First conductive pads 305 electrically connected to the first through vias 303 may be formed in the one area 11 of the semiconductor wafer 301.

Referring to FIG. 8, trenches 307 are formed in the cutting areas SR and the edge areas ER of the semiconductor wafer 301. The trenches 307 may be formed to have a bottom that is disposed on the same plane as or a plane lower than a bottom of the first through vias 303. The trenches 307 may be formed through, for example, a laser process, a mechanical cutting process, and an etching process (e.g., dry etching, wet etching, etc.).

Referring to FIG. 9, a plurality of first semiconductor chips 309 is stacked on the one side 11 of the semiconductor wafer 301. The first semiconductor chips 309 may be stacked on the chip areas CR vertically from the semiconductor wafer 301. At least one among the first semiconductor chips 309 may be disposed on and electrically contact the first conductive pads 305 at the one side 11 of the semiconductor wafer 301.

Chip pads 311 may be formed at the both sides of the first semiconductor chip 309, except for a top side of an uppermost one of the stacked first semiconductor chips 309. Chip terminals 313 may be disposed between the facing chip pads 311 so that the first semiconductor chips 309 may be stacked on one another in an electrically connecting manner. Chip through vias 315 penetrating the first semiconductor chips 309 may be formed therein. The chip through vias 315 may be connected to the facing chip pads 311. The first semiconductor chips 309 may be, for example, a memory chip (e.g., DRAM).

Figure 10:
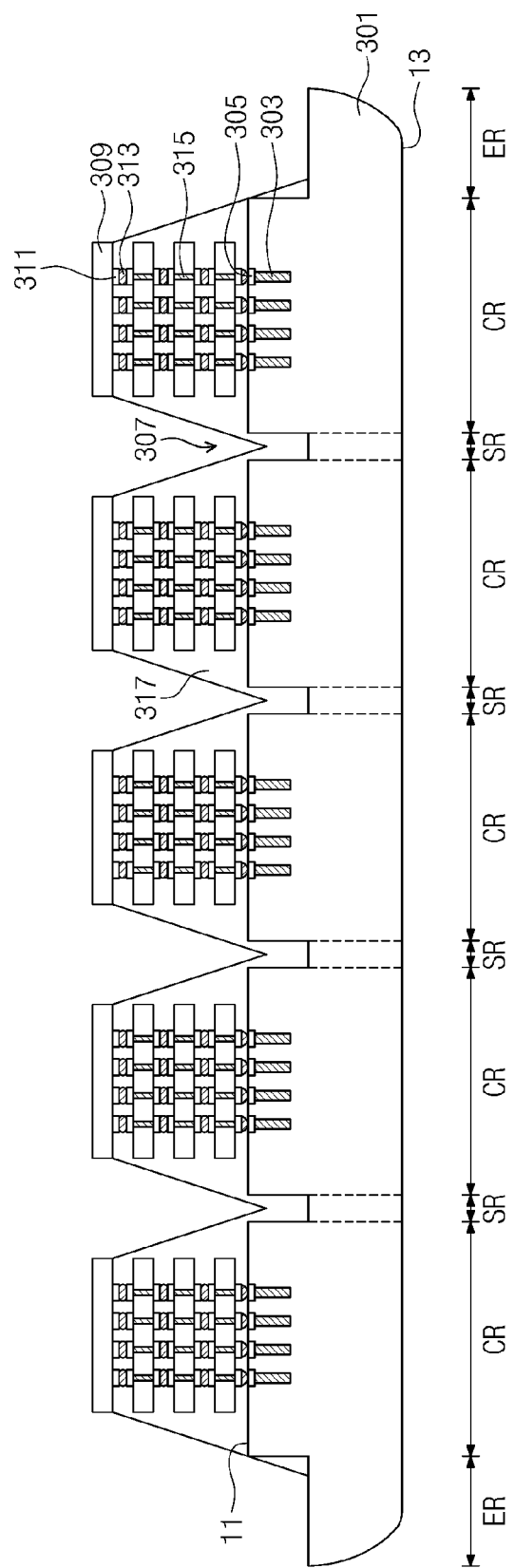

Referring to FIG. 10, an under fill resin layer 317 is formed between the first semiconductor chips 309. For example, the under fill resin layer 317 may be formed by injecting a dielectric material in under fill form between the semiconductor wafer 301 and the first semiconductor chip 309 and between the first semiconductor chips and hardening it. The under fill resin layer 317 may be formed to, for example, completely cover the one side 11 of the semiconductor wafer 310 and the sides of the trenches 307. The under fill resin layer 317 may be formed by using polymer, for example, epoxy.

Figure 11:
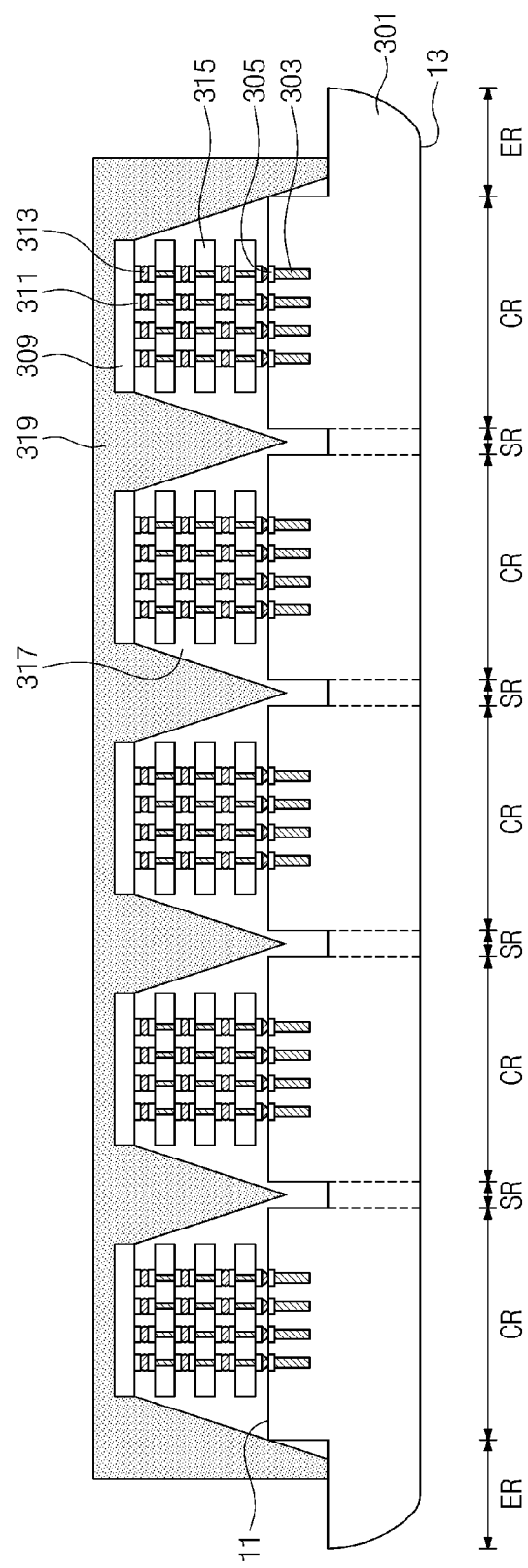

Referring to FIG. 11, a first molding layer 319 is formed on the one side 11 of the semiconductor wafer 301. The first molding layer 319 may be formed to, for example, completely fill the trenches 307. The first molding layer 319 may be formed to fill a portion of the trenches 307 formed in the edge areas ER. The first molding layer 319 may be formed to, for example, completely cover the first semiconductor chips 309.

Referring back to the example embodiment of the inventive concepts as illustrated in FIG. 5, the first molding layer 319 may be formed to expose a top surface of an uppermost one of the first semiconductor chips 309.

Referring back to the example embodiment of the inventive concepts as illustrated in FIG. 6, the first molding layer 319 may be formed to expose a top portion of the under fill resin layer 317.

Referring to FIG. 12, the other side 13 of the semiconductor wafer 301 is polished until the first through vias 303 are exposed. The semiconductor wafer 301 may be polished by performing, for example, chemical mechanical polishing (CMP).

Referring to FIGS. 13 and 14, after the first through vias 303 are exposed, a first insulating layer 321 may be formed on the other side 13 of the semiconductor wafer 301. The first insulating layer 321 may expose the first through vias 303 and a second conductive pad 325 therethrough. The first insulating layer 321 may be a silicon oxide layer or a silicon nitride layer, for example.

Redistribution layers 323 contacting the first through vias 303 may be formed on the other side 13 of the semiconductor wafer 301. For example, the redistribution layers 323 may be disposed on the second conductive pads 325. A barrier metal layer 327 may be disposed between the second conductive pads 325 and the redistribution layers 323. The barrier metal layer 327 may contact the second conductive pads 325 and the redistribution layers 323. The redistribution layers 323 may be connected to active devices in the semiconductor wafer 301, passing through the second conductive pads 325. A second insulating layer 329 may be disposed between the first through vias 303 and the semiconductor wafer 301 for insulation.

When the redistribution layers 323 are formed, test pads 331 may be formed simultaneously. The test pads 331 may be electrically connected to the input terminals and the output terminals of the first semiconductor chips 309 through interconnections (not shown) connected to the first through vias 303 and the chip through vias 315. A probe needle of a probe card may contact the test pads 331 to test electrical characteristics of the first semiconductor chips 309 in a wafer level molding state.

Figure 15:
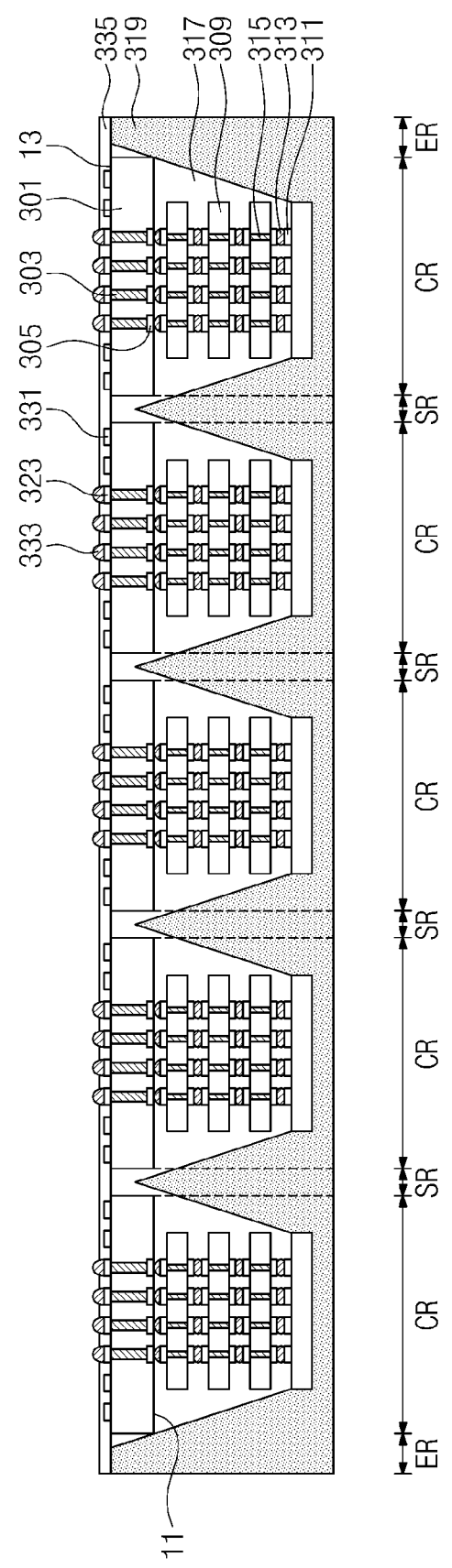

Referring to FIG. 15, first terminals 333 are formed at the redistribution layers 323. The first terminals 333 may be formed through, for example, a screen print technique, an inkjet technique, or a soldering technique.

A first passivation layer 335 may be formed at the other side 13 of the semiconductor wafer 301. The first passivation layer 335 may be formed to, for example, completely cover the redistribution layers 323 and the test pads 331, and expose a portion of the first terminals 333.

Figure 16:
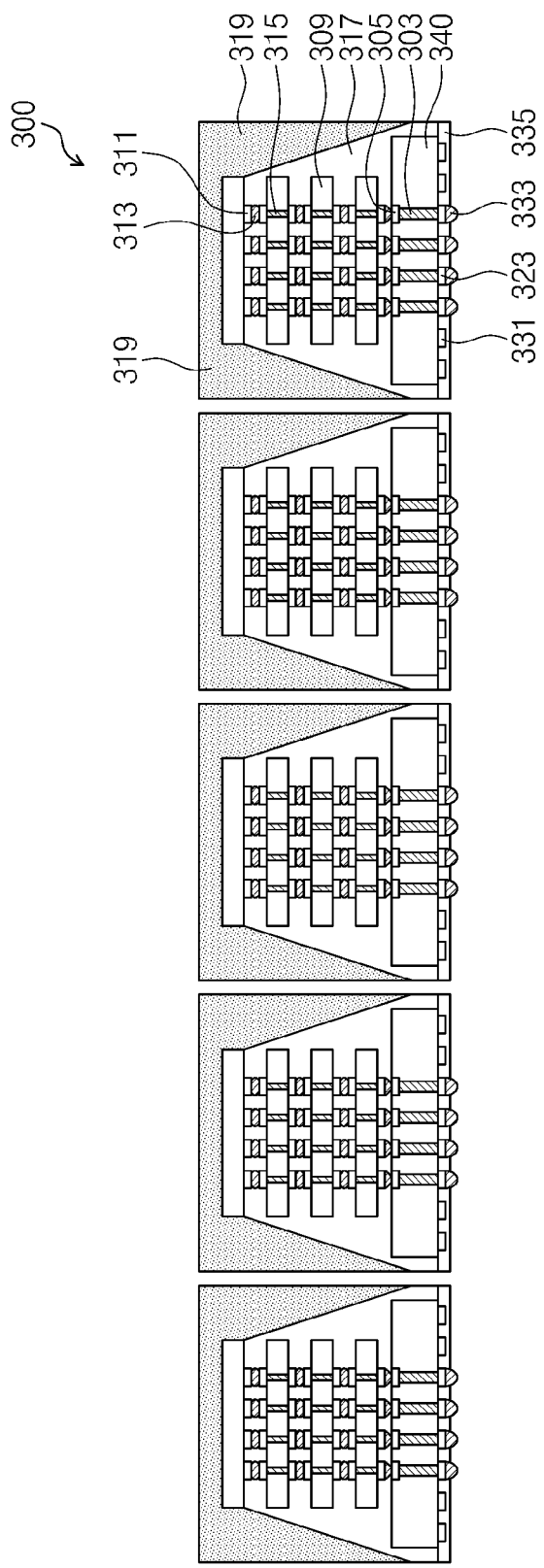

Referring to FIG. 16, the semiconductor wafer 301 is divided by performing a cutting process on the cutting areas SR of the semiconductor wafer 301, thereby forming a chip stacked semiconductor package 300. The chip stacked semiconductor package 300 may be, for example, a memory semiconductor package. As shown in the drawing, the chip stacked semiconductor package 300 may include the plurality of first semiconductor chips 309 stacked on a semiconductor substrate 340. The first semiconductor chips 309 may be electrically connected to each other through chip through vias 315 penetrating therethrough. A width of the semiconductor substrate 340 may be narrower than a width of the under fill resin layer 317 at a bottom such that the under fill resin layer 317 covers sides of the semiconductor substrate 340. The width of the under fill resin layer 317 at the bottom may be broader than a width of the under fill resin layer 317 at a top. The chip stacked semiconductor package 300 may have a structure in which active sides of the first semiconductor chips 309 are stacked on an active area of the semiconductor substrate 340 on the one side 11.

By filling the trenches 307 of the semiconductor wafer 301, after a polishing process, with the under fill resin layer 317 and the molding layer 319, the edges of the semiconductor wafer 301 may be protected by the under fill resin layer 317 and the molding layer 319. Accordingly, subsequent processes may be performed without inflicting damage on the semiconductor wafer 301. Moreover, after performing the cutting process for dividing the semiconductor wafer 301 into the individual chip stacked semiconductor packages 300, the edges of the semiconductor substrate 340 of the chip stacked semiconductor package 300 may be protected by the under fill resin layer 317 and the molding layer 319. Accordingly, reliability of the chip stacked semiconductor package 300 may be improved.

Figure 17:
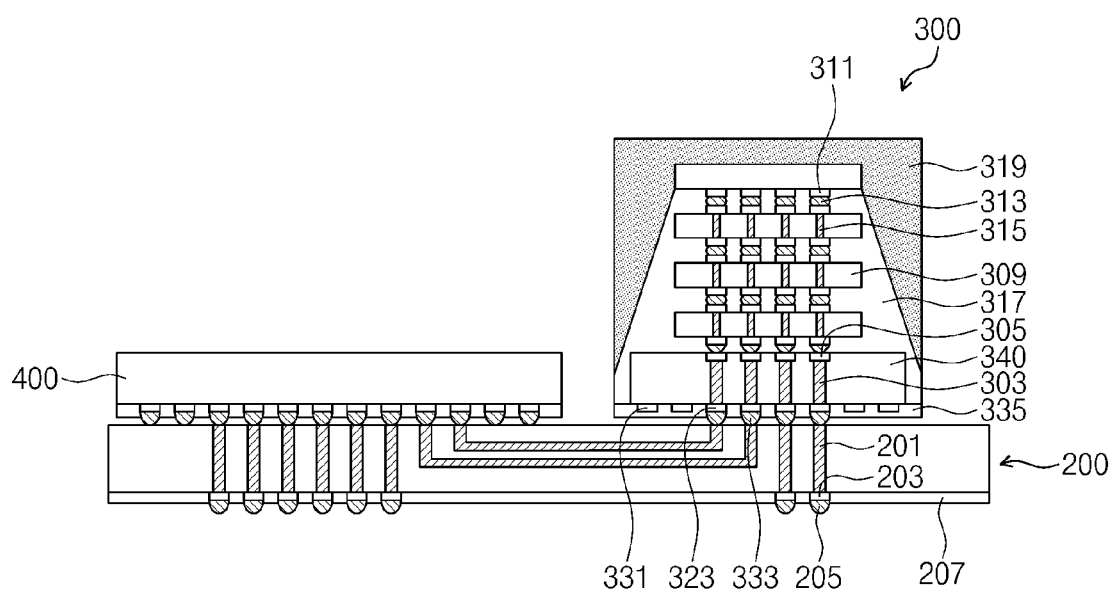

Referring to FIG. 17, interposer pads 203 contacting second through vias 201 and second terminals 205 attached on the interposer pads 203 may be disposed at a bottom of an interposer substrate 200. A second passivation layer 207 covering the interposer pads 203 and exposing a portion of the second terminals 205 may be further formed on the bottom of the interposer substrate 200.

A CPU 400 may be further mounted on the interposer substrate 200.

Referring to FIGS. 1 and 2, the interposer substrate 200 may be stacked on, for example, a logic semiconductor package 100. The first terminals 333 contact a second semiconductor chip 103, so that a second semiconductor chip 103 in the logic semiconductor package 100 may be electrically connected to first semiconductor chips 309 through, for example, the second through vias 201, the first terminals 333, the redistribution layer 323, the interposer pad 203, and the second terminals 205. The interposer substrate 200 may be stacked on the logic semiconductor package 100 and the logic semiconductor package 100 and the interposer substrate 200 may be electrically connected to each other.

FIGS. 18 to 23 are cross-sectional views illustrating a method of fabricating a semiconductor package according to another example embodiment of the inventive concepts. For convenience of description, like reference numerals refer to like elements that are substantially identical to those in the example embodiment shown in FIGS. 7 to 17 and also descriptions for corresponding elements are omitted.

Figure 18:
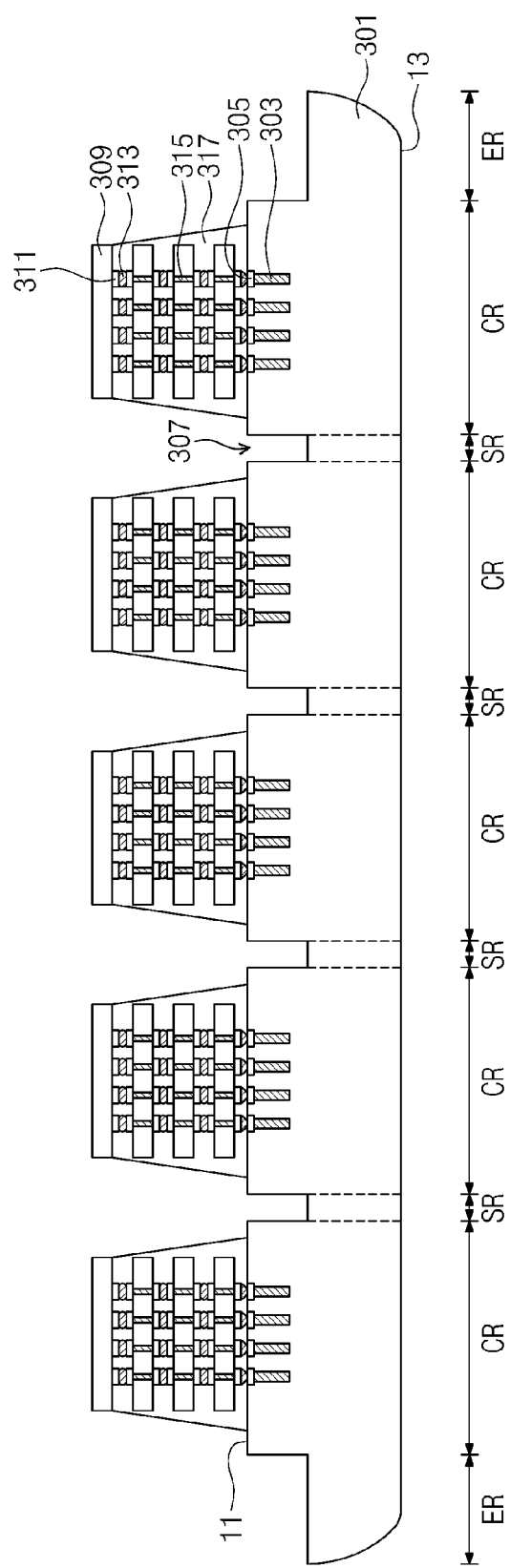
FIGS. 18 to 23 are cross-sectional views illustrating a method of fabricating a semiconductor package according to another example embodiment of the inventive concepts.

Referring to FIG. 18, an under fill resin layer 317 is formed between the first semiconductor chips 309 stacked on the semiconductor wafer 301. The under fill resin layer 317 may be formed to fill between the first semiconductor chips 309 and cover the sides of the first semiconductor chips 309 and a portion of the one side 11 of the semiconductor wafer 301. The under fill resin layer 317 may expose a portion of the one side 11 of the semiconductor wafer 301. Referring to the example embodiment of the inventive concepts as illustrated in FIG. 4, the under fill resin layer 317 may be formed to, for example, completely cover the sides of the first semiconductor chips 309 and the one side 11 of the semiconductor wafer 301.

Figure 19:
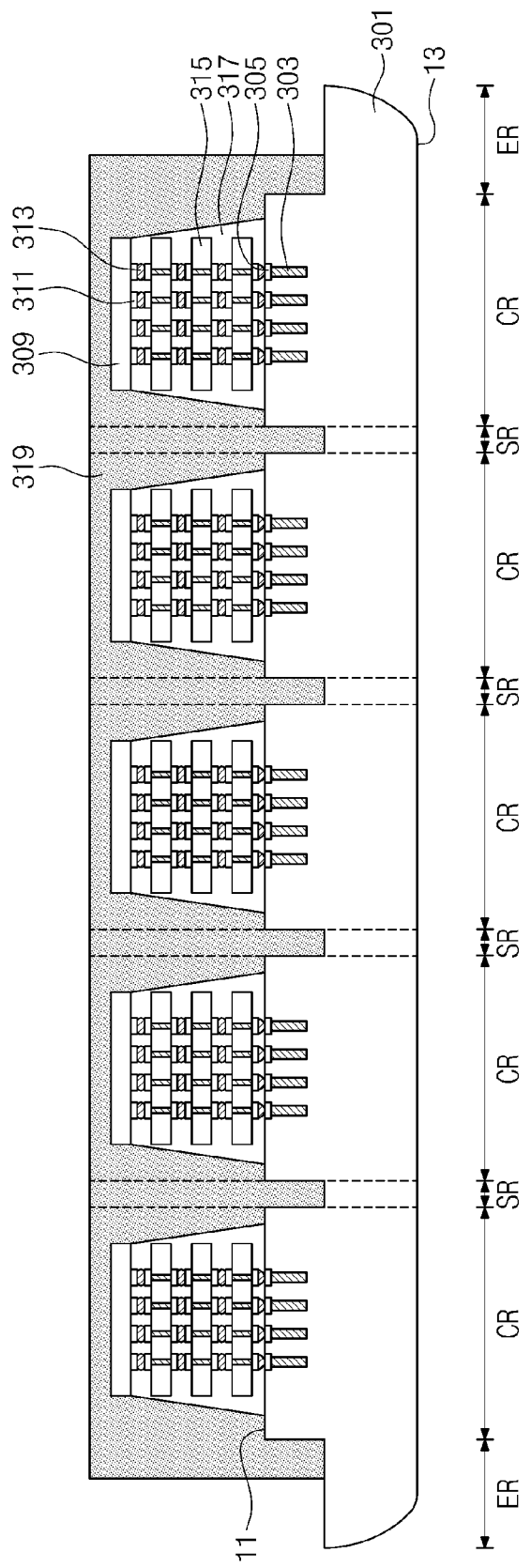

Referring to FIG. 19, the first molding layer 319 is formed on the semiconductor wafer 301 where the under fill resin layer 317 is formed. The first molding layer 319 may be formed to, for example, completely fill trenches 307 and cover the under fill resin layer 317.

Figure 20:
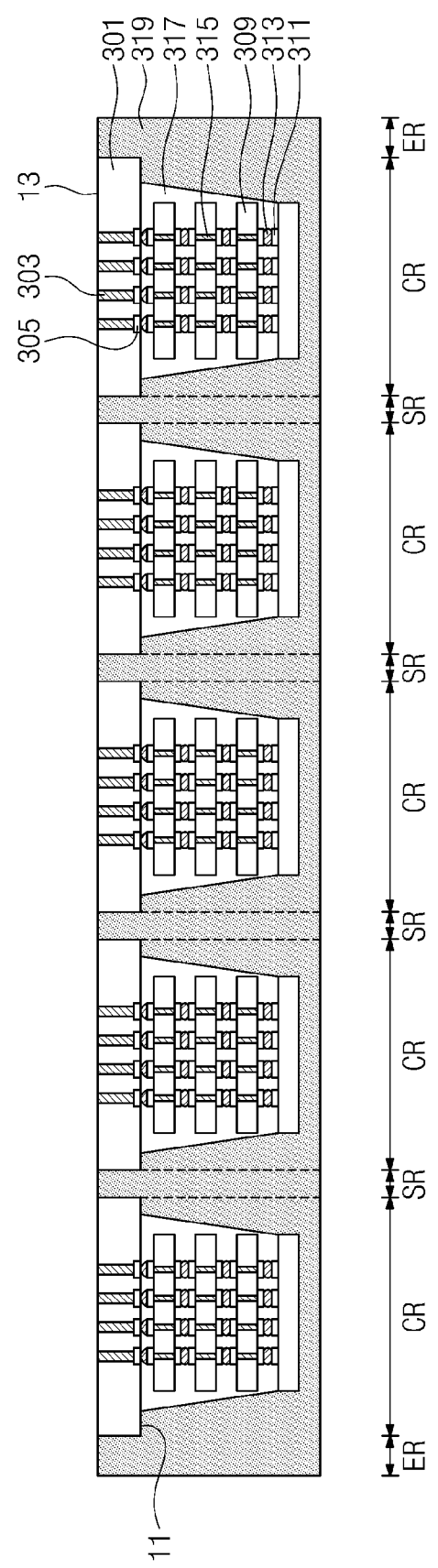

Referring to FIG. 20, a polishing process is performed on the other side 13 of the semiconductor wafer 301 until the first through vias 303 are exposed.

Figure 21:
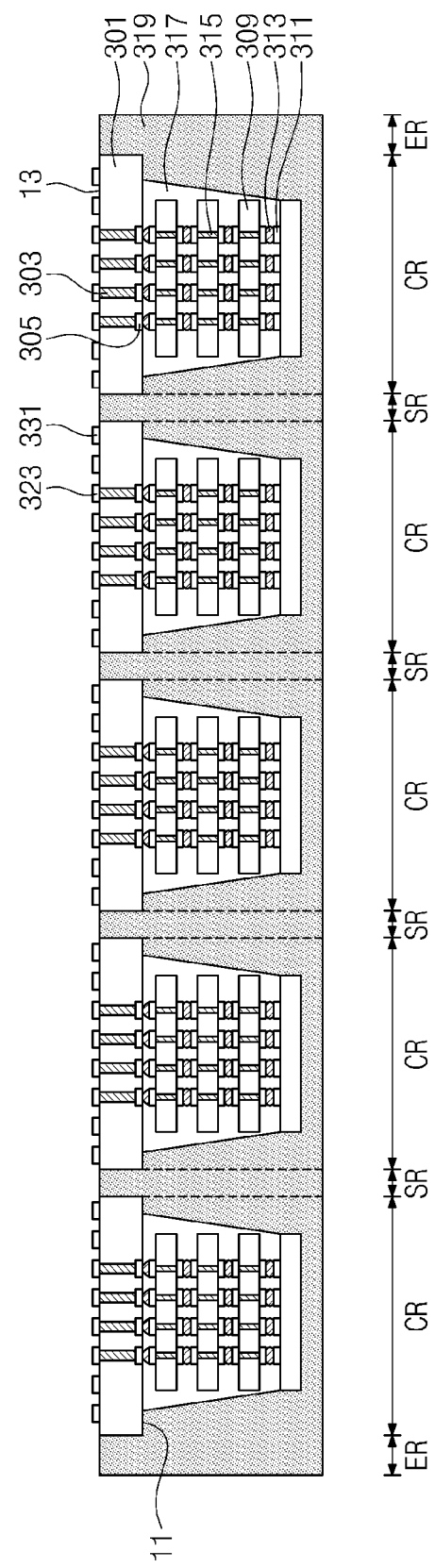

Referring to FIG. 21, the redistribution layers 323 and the test pads 331 may be formed on the other side 13 of the semiconductor wafer 301.

Figure 22:
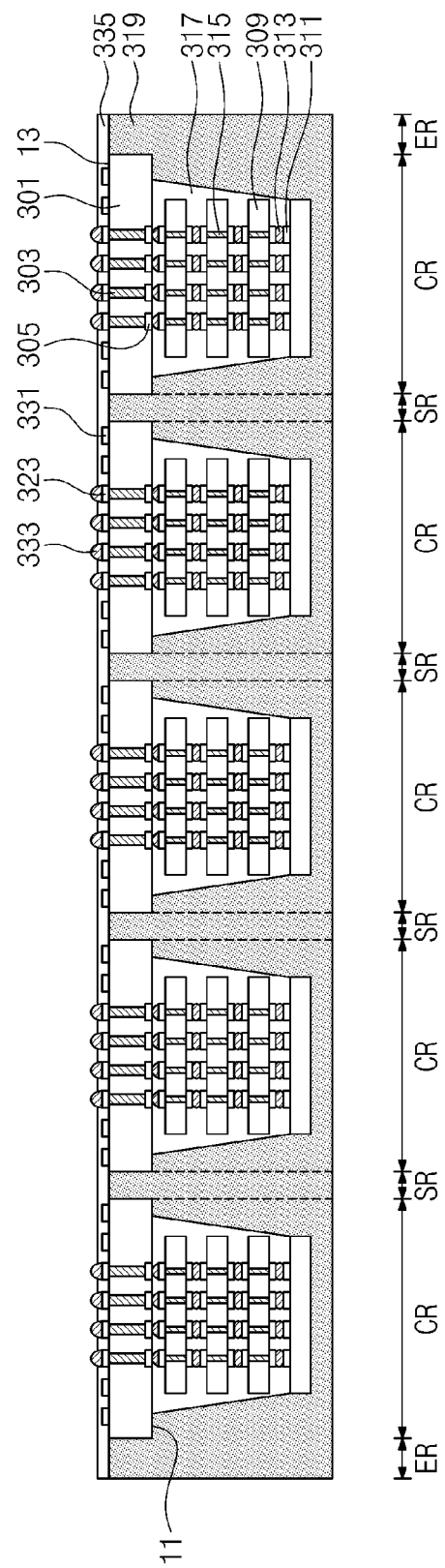

Referring to FIG. 22, first terminals 333 are attached on the redistribution layers 323. Then, the first passivation layer 335 may be formed to expose a portion of the first terminals 333 and cover the redistribution layers 323 and the test pads 331.

Figure 23:
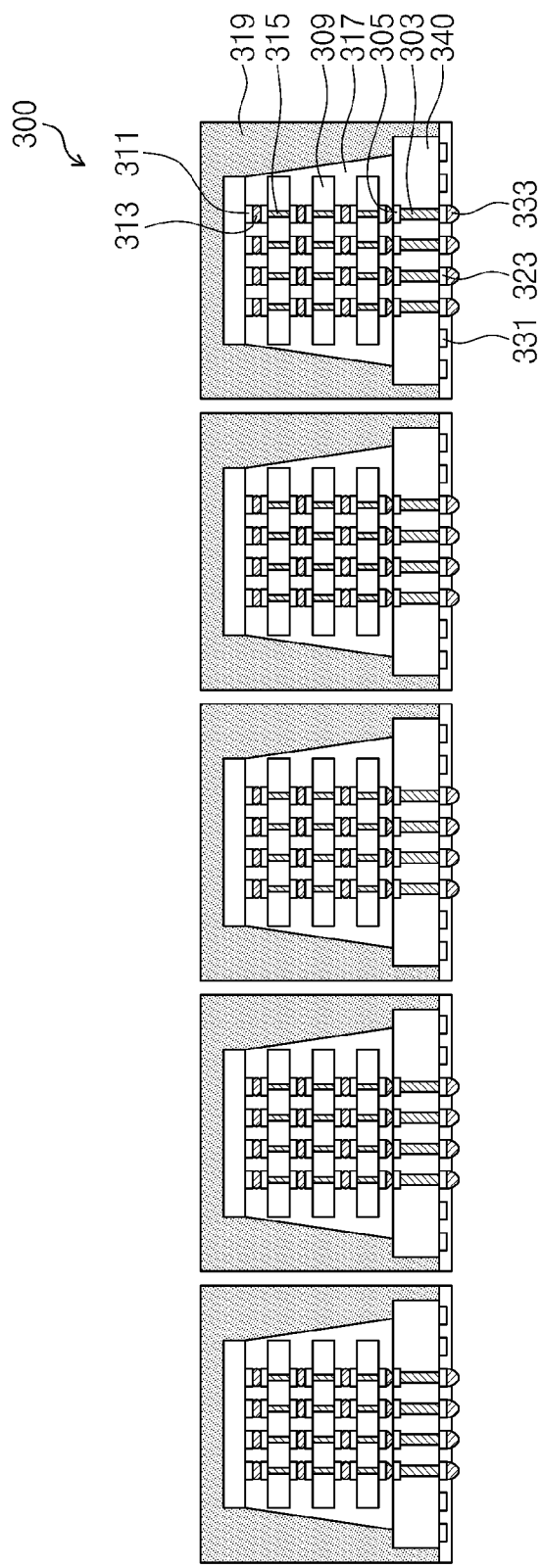

Referring to FIG. 23, a cutting process is performed on the cutting areas SR of the semiconductor wafer 340 to form the individual chip stacked semiconductor packages 300, in each of which the first semiconductor chips 309 are stacked on the semiconductor substrate 340.

Referring back to FIG. 3, the chip stacked semiconductor package 300 may be stacked on the interposer substrate 200. The interposer substrate 200 on which the chip stacked semiconductor package 300 is stacked may be stacked on the logic semiconductor package 100 such that the semiconductor device 2000 in which the chip stacked semiconductor package 300 and the logic semiconductor package 100 are connected to each other may be formed.

Figure 24:
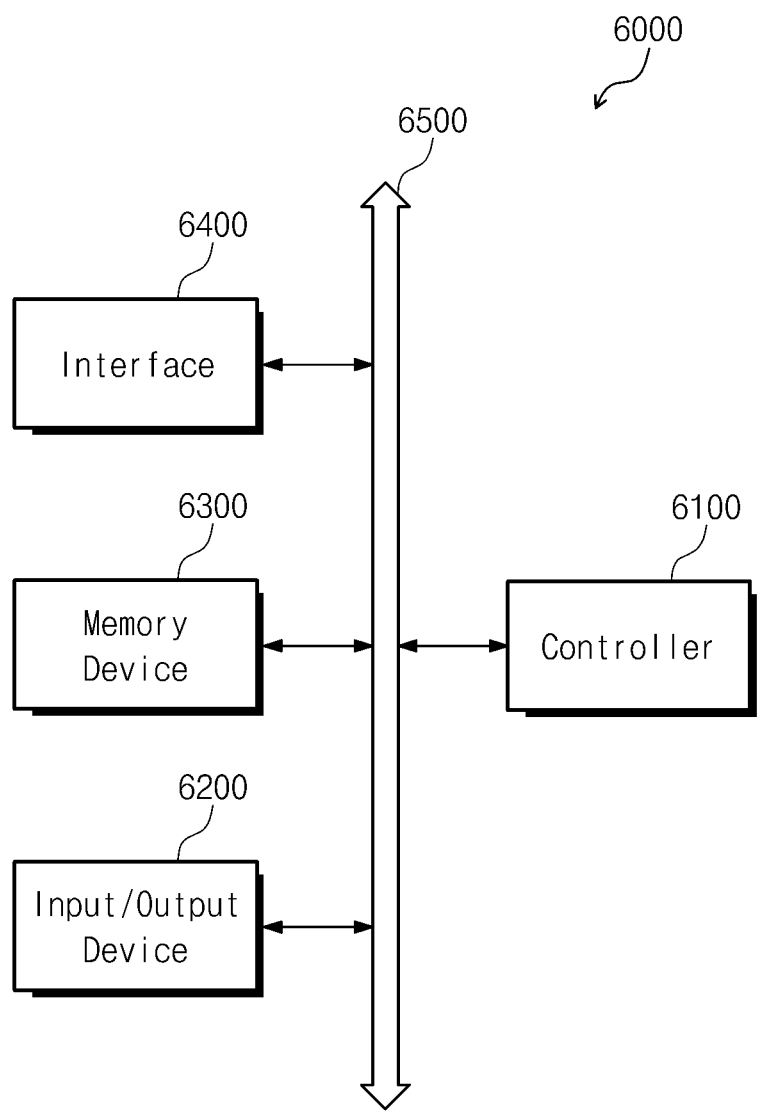
FIG. 24 is a block diagram illustrating an electronic device including at least one semiconductor package according to one or more example embodiments of the inventive concepts.
Figure 25:
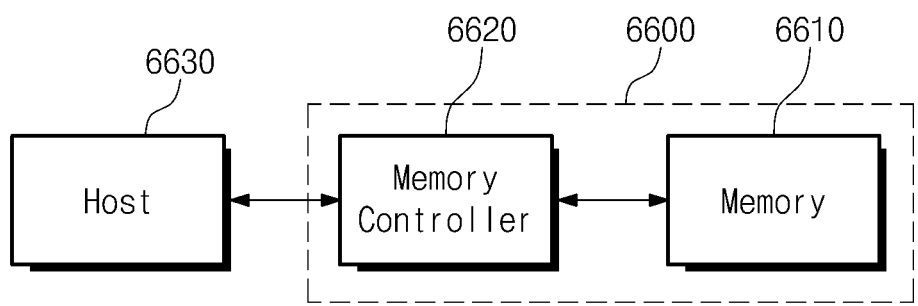
FIG. 25 is a block diagram illustrating a memory system including at least one semiconductor package according to one or more example embodiments of the inventive concepts.

FIG. 24 is a block diagram illustrating an electronic system including at least one semiconductor package according to one or more example embodiments of the inventive concepts. FIG. 25 is a block diagram illustrating a memory system including at least one semiconductor package according to one or more example embodiments of the inventive concepts.

Referring to FIG. 24, an electronic device 6000 includes a controller 6100, an input/output device 6200, and a memory device 6300. The controller 6100, the input/output device 6200, and the memory device 6300 may be electrically connected to each other through a bus 6500. The bus 6500 may be a path through which, for example, data and/or instructions are transferred. For example, the controller 6100, as at least one microprocessor, may include, for example, at least one of digital signal processors, micro controllers, and logic devices. The controller 6100 and the memory device may include semiconductor packages according to one or more example embodiments of the inventive concepts. The input/output device 6200 may include, for example, at least one of a keypad, a keyboard, and a display. The memory device 6300 is a device for storing data. The memory device 6300 may store data and/or instructions executed by the controller 6100. The memory device 6300 may include, for example, a volatile memory device and/or a nonvolatile memory device. For example, the memory device 6300 may be a flash memory. For example, a flash memory formed according to an example embodiment of the inventive concepts may be mounted in an information processing system (e.g., a mobile device, a desktop computer, etc.). Such a flash memory may be configured as a semiconductor disk device (SSD). In this case, the electronic system 6000 may store large amounts of data in the electronic system 6000. The electronic system 6000 may further include an interface 6400 to transmit/receive data to/from a communication network. The interface 6400 may be in a wired/wireless form. For example, the interface 6400 may include, for example, an antenna or a wired/wireless transceiver. Although not shown in the drawings, it is apparent to those skilled in the art that the electronic system 6000 may further include, for example, application chipsets and/or camera image processors (CISs).

The electronic system 6000 may be implemented with, for example, a mobile system, a personal computer, an industrial computer, or a logic system performing various functions. For example, the mobile system may be one of a Personal Digital Assistant (PDA), a portable computer, a web tablet, a mobile phone, a wireless phone, a laptop computer, a memory card, a computer, a memory card, a digital music system, and an information transmitting/receiving system. When the electronic system 6000 is equipment performing wireless communication, the electronic system 6000 may be used for communication interface protocols of the third generation communication system, for example, CDMA, GSM, NADC, E-TDMA, WCDAM, or CDMA1000.

Referring to FIG. 25, a memory card 6600 includes a nonvolatile memory device 6610 and a memory controller 6620. The nonvolatile memory device 6610 and the memory controller 6620 may store data and/or read the stored data. The nonvolatile memory device 6610 may include one or more semiconductor packages 300 according to one or more example embodiment of the inventive concepts. The memory controller 6620 may read stored data in response to a read/write request of a host 6630 or may control the nonvolatile memory device 6610 to store data.

A method of fabricating a semiconductor package according to an example embodiment of the inventive concepts includes forming trenches in a semiconductor wafer where semiconductor chips are stacked and filling the trenches with an under fill resin layer and a molding layer. Accordingly, after a polishing process is performed on the semiconductor wafer, the edges of the semiconductor wafer are protected by the under fill resin layer and the molding layer. Additionally, after a cutting process is performed on the semiconductor wafer, the edges of the semiconductor package are protected by the under fill resin layer and the molding layer. Accordingly, reliability of the semiconductor package may be improved.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of fabricating a semiconductor package, the method comprising:
    preparing a semiconductor wafer having a first side and a second side, the second side facing the first side, and the semiconductor wafer including a through via exposed at the first side;
    forming trenches at cutting areas between chip areas and at edge areas of the semiconductor wafer on the first side;
    stacking a semiconductor chip on the through via;
    forming an under fill resin layer to fill a gap between the semiconductor chip and the semiconductor wafer and to cover a side of the semiconductor chip;
    forming a molding layer to cover the under fill resin layer and filling at least a portion of the respective trenches; and
    polishing the second side of the semiconductor wafer until a thickness of the semiconductor wafer is equal to or less than a depth of each of the trenches to expose the through via.

2. The method of claim 1, wherein the forming trenches includes forming the trenches to have the depth equal to or deeper than the through via.

3. The method of claim 1, wherein the forming an under fill resin layer includes forming the under fill resin layer on the semiconductor wafer.

4. The method of claim 3, wherein the forming an under fill resin layer includes forming the under fill resin layer to extend toward sides of the trenches.

5. The method of claim 1, after the forming a molding layer, further comprising:
    simultaneously forming a redistribution layer and a test pad on the second side of the semiconductor wafer; and
    cutting the cutting areas and the edge areas of the semiconductor wafer to form a semiconductor package.

6. The method of claim 1, wherein the forming a molding layer includes forming the molding layer to completely cover a top of the semiconductor chip.

7. A method of fabricating a semiconductor package, the method comprising:
    forming trenches in a first surface of a semiconductor wafer at cutting areas between chip areas and at edge areas of the semiconductor wafer;

stacking at least one semiconductor chip on the first surface;

forming an under fill resin layer to fill a gap between the semiconductor chip and the semiconductor wafer and to cover a side of the semiconductor chip;

forming a molding layer to cover at least a portion of the under fill resin layer and to fill at least a portion of each of the trenches;

polishing a second surface of the semiconductor wafer to a thickness to expose a substrate through via, the substrate through via embedded in the semiconductor wafer, the second surface of the semiconductor wafer facing the first surface of the semiconductor wafer; and cutting the cutting areas and the edge areas of the semiconductor wafer to form the semiconductor package, the semiconductor package including a package substrate split from the semiconductor wafer, wherein at least one side surface of the package substrate is completely covered by at least one of the under fill resin layer or the molding layer.

8. The method of claim 7, wherein the forming a molding layer includes forming the molding layer to cover a lower portion of a side surface of the under fill resin layer.

9. The method of claim 7, wherein the forming a molding layer includes forming the molding layer to cover side surfaces of the trenches.

10. The method of claim 7, wherein the forming a molding layer includes forming the molding layer to expose a top surface of the first semiconductor chip.

11. The method of claim 7, wherein the forming an under fill resin layer includes forming the under fill resin layer to cover side surfaces of the trenches.

12. The method of claim 7, wherein the forming an under fill resin layer is performed such that a width of the under fill resin layer at a bottom is wider than a width of the under fill resin layer at a top.

13. The method of claim 7, wherein a width of the under fill resin layer at a bottom is narrower than or substantially equal to a width of a bottom surface of the semiconductor package.

14. The method of claim 7, further comprising:

mounting the semiconductor wafer on an interposer, the interposer including an interposer through via, such that the substrate through via is electrically connected to at least one semiconductor chip via included in the semiconductor chip or the interposer through via.

* * * * *